US008604674B2

(12) United States Patent
Fujimoto

(10) Patent No.: US 8,604,674 B2
(45) Date of Patent: Dec. 10, 2013

(54) PIEZOELECTRIC POWER GENERATOR AND WIRELESS SENSOR NETWORK APPARATUS

(75) Inventor: Katsumi Fujimoto, Kyoto-fu (JP)

(73) Assignee: Murata Manufacturing Co., Ltd., Nagaokakyo-Shi, Kytoto-fu (JP)

( * ) Notice: Subject to any disclaimer, the term of this patent is extended or adjusted under 35 U.S.C. 154(b) by 0 days.

(21) Appl. No.: 13/310,869

(22) Filed: Dec. 5, 2011

(65) Prior Publication Data

US 2012/0074812 A1 Mar. 29, 2012

Related U.S. Application Data

(63) Continuation of application No. PCT/JP2010/060803, filed on Jun. 25, 2010.

(30) Foreign Application Priority Data

Jun. 26, 2009 (JP) ................................ 2009-152309

(51) Int. Cl.
*H01L 41/08* (2006.01)

(52) U.S. Cl.
USPC .......................................... 310/339; 310/329

(58) Field of Classification Search
USPC .......................................... 310/321, 344, 348
See application file for complete search history.

(56) References Cited

U.S. PATENT DOCUMENTS 3,566,166 A * 2/1971 Manfred Borner ........... 310/321
4,327,359 A * 4/1982 Kurtz ............................ 340/566
4,373,378 A * 2/1983 Fujishiro et al. ............ 73/35.11
4,494,409 A * 1/1985 Kondo et al. ................... 73/651
4,972,713 A * 11/1990 Iwata .............................. 73/654
5,245,245 A * 9/1993 Goldenberg .................. 310/330
5,796,000 A * 8/1998 Fujiu et al. ................. 73/504.15
5,856,722 A * 1/1999 Haronian et al. ............. 310/321
6,223,601 B1 * 5/2001 Harada et al. ................... 73/649
6,336,366 B1 * 1/2002 Thundat et al. ............ 73/514.34
7,116,035 B2 * 10/2006 Sugawara ..................... 310/322
7,687,977 B2 * 3/2010 Xu ............................... 310/339
7,898,157 B2 * 3/2011 Churchill et al. ............. 310/339
8,022,600 B2 * 9/2011 Hirasawa et al. ............. 310/339
2006/0125489 A1 * 6/2006 Feucht et al. ................. 324/633
2010/0175155 A1 * 7/2010 Sahin ................................ 850/6

FOREIGN PATENT DOCUMENTS

JP 11-303726 A 11/1999
JP 3170965 B 3/2001
JP 2001-231273 A 8/2001
JP 2001-275370 A 10/2001
JP 2007-300140 A 11/2007
JP 2008-113973 A 5/2008
JP 2008-522184 A 6/2008

OTHER PUBLICATIONS

PCT/JP2010/060803 International Search Report dated Aug. 20, 2010.
PCT/JP2010/060803 Written Opinion Report dated Aug. 20, 2010.

* cited by examiner

*Primary Examiner* — Mark Budd
(74) *Attorney, Agent, or Firm* — Dickstein Shapiro LLP

(57) ABSTRACT

A piezoelectric power generator that includes a piezoelectric multilayer body including a piezoelectric element that converts vibration into electricity and a substrate on which the piezoelectric multilayer body is mounted. The resonant frequency of the piezoelectric element coincides with the reference of the substrate so that the piezoelectric element efficiently vibrates. The addition of vibration portions in the substrate allows various resonant frequencies to be set.

12 Claims, 4 Drawing Sheets

10
40

10 51 41 40

PIEZOELECTRIC POWER GENERATOR AND WIRELESS SENSOR NETWORK APPARATUS

CROSS REFERENCE TO RELATED APPLICATIONS

The present application is a continuation of International application No. PCT/JP2010/060803, filed Jun. 25, 2010, which claims priority to Japanese Patent Application No. 2009-152309, filed Jun. 26, 2009, the entire contents of each of which are incorporated herein by reference.

FIELD OF THE INVENTION

The present invention relates to piezoelectric power generators. More particularly, the present invention relates to a piezoelectric power generator for converting kinetic energy into electrical energy by using a piezoelectric element to extract electric power and a wireless sensor network apparatus provided with the piezoelectric power generator.

BACKGROUND OF THE INVENTION

Patent Literature 1 describes the basic configuration and the principle of operation of a typical piezoelectric power generator in related art, which converts kinetic energy that is externally input into electrical energy by using a piezoelectric element to extract electric power and supplies the electric power to an electric storage device. Setting of a free vibration frequency of a free vibration member in a region in which the frequency components of an exciting acceleration frequently occur is described in Patent Literature 1. In addition, Patent Literature 1 indicates that, when the frequency components of the acceleration are known, the dimensions of the element can be adjusted to set the natural frequency in an appropriate region in order to maximize the output.

In the piezoelectric power generator described in Patent Literature 1, a large change in stress is momentarily applied to the piezoelectric element in response to an instantaneous impact that is exerted to output large electric power. However, in order to continuously extract stable electric power, it is necessary to continue vibration and to use a relatively large rectifier and/or capacitor having a higher dielectric strength and/or connect multiple components, thus increasing the number of components or increasing the size of the generator. In addition, since it is necessary to exert the kinetic energy to all the piezoelectric elements, there is a problem in that the stress is dispersed to decrease the generation efficiency.

Patent Literature 1: Japanese Patent No. 3170965

SUMMARY OF THE INVENTION

In order to resolve the above problems, it is an object of the present invention to provide a piezoelectric power generator capable of efficiently transfer vibration that is externally exerted to a piezoelectric element to increase the possible generation time and improve the generation efficiency.

It is another object of the present invention to provide a compact wireless sensor network apparatus owing to provision of the piezoelectric power generator.

A piezoelectric power generator according to a first embodiment of the present invention includes a piezoelectric element converting vibration into electricity and a substrate on which the piezoelectric element is mounted. The piezoelectric power generator is characterized in that a resonant frequency of the piezoelectric element coincides with a resonant frequency of the substrate.

In the piezoelectric power generator, vibration externally exerted on the substrate is transferred to the piezoelectric element through the substrate to generate electric power. Since the resonant frequency of the piezoelectric element coincides with the resonant frequency of the substrate, the piezoelectric element efficiently vibrates as long as the substrate vibrates. As a result, the possible generation time is increased to improve the generation efficiency.

A wireless sensor network apparatus according to a second embodiment of the present invention includes a substrate; a piezoelectric power generator that is mounted on the substrate and that includes a piezoelectric element converting vibration into electricity; a wireless communication apparatus mounted on the substrate; and a sensor element mounted on the substrate. The wireless sensor network apparatus is characterized in that a resonant frequency of the piezoelectric element coincides with a resonant frequency of the substrate.

In the wireless sensor network apparatus, information detected by the sensor is transmitted to an external host apparatus through the wireless communication apparatus. The piezoelectric power generator functions as a power source of the wireless communication apparatus and/or the sensor. The vibration is efficiently transferred in the piezoelectric power generator owing to the relationship between the piezoelectric power generator and the substrate and the wireless communication apparatus, the sensor, etc. are mounted on the substrate. Consequently, the components are mounted at high density and the wireless sensor network apparatus is reduced in size.

According to the present invention, it is possible to provide a piezoelectric power generator with higher generation efficiency. In addition, it is possible to provide a compact wireless sensor network apparatus.

DETAILED DESCRIPTION OF THE INVENTION

Embodiments of a piezoelectric power generator and a wireless sensor network apparatus according to the present invention will herein be described with reference to the attached drawings.

(Embodiments of Piezoelectric Power Generator, Refer to FIGS. 1(A) to 1(D))

FIGS. 1(A) to 1(D) show first to fourth embodiments of a piezoelectric power generator according to the present invention. These piezoelectric power generators each include a piezoelectric multilayer body 10 including a piezoelectric element that converts vibration into electricity, and a substrate 40 on which the piezoelectric multilayer body 10 is mounted. The resonant frequency of the piezoelectric element coincides with the resonant frequency of the substrate 40. The substrate 40 is, for example, a paper phenol substrate (FR-1, 2), a paper epoxy substrate (FR-3), a glass composite substrate (CEM-3), a glass epoxy substrate (FR-4), a glass polyimide substrate, a fluorine substrate, a glass polyphenylene oxide (PPO) substrate, a metal substrate, or a ceramic substrate.

The piezoelectric multilayer body 10 may include a single piezoelectric element or may include multiple piezoelectric elements, as described below with reference to FIGS. 2 to 4. When the piezoelectric multilayer body 10 includes multiple piezoelectric elements, the respective piezoelectric elements may have the same resonant frequency or different resonant frequency.

Figure 1A:
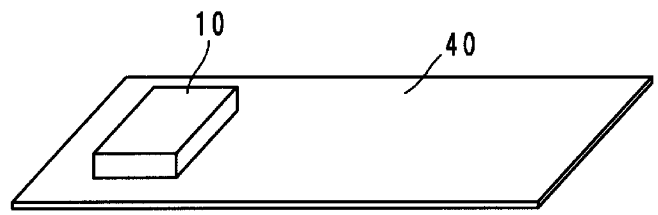
FIGS. 1(A) to 1(D) include perspective views showing various embodiments of a piezoelectric power generator according to the present invention.
Figure 1B:
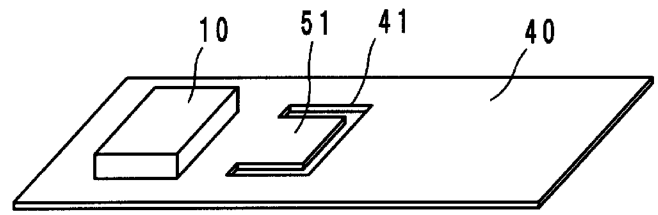

FIG. 1(A) shows the first embodiment in which the resonant frequency of the plate substrate 40 itself having rectangular main faces that are opposed to each other coincides with the resonant frequency of the piezoelectric element. FIG. 1(B) shows the second embodiment in which the substrate 40 includes a vibration portion 51 formed of a notch 41 passing thorough the substrate 40 and the resonant frequency of the vibration portion 51 coincides with the resonant frequency of the piezoelectric element.

Figure 1C:
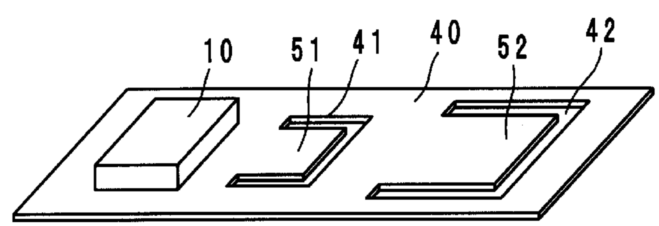

FIG. 1(C) shows the third embodiment in which the substrate 40 includes vibration portions 51 and 52 formed of notches 41 and 42 passing through the substrate 40. The vibration portions 51 and 52 have different resonant frequency and the piezoelectric multilayer body 10 includes piezoelectric elements having resonant frequency coinciding with the resonant frequency of the respective vibration portions 51 and 52.

Figure 1D:
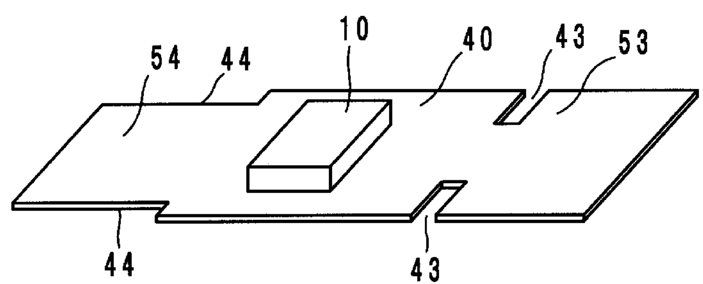

FIG. 1(D) shows the fourth embodiment in which the substrate 40 includes vibration portions 53 and 54 formed of notches 43 and 44 provided on both ends of the substrate 40. The vibration portions 53 and 54 have different resonant frequency in which the vibration nodes exist near the notches 43 and 44. The piezoelectric multilayer body 10 includes piezoelectric elements having resonant frequency coinciding with the resonant frequency of the respective vibration portions 53 and 54.

In the first embodiment shown in FIG. 1(A), vibration externally exerted on the substrate 40 is transferred to the piezoelectric multilayer body 10 through the substrate 40 to generate electric power. Since the resonant frequency of the piezoelectric element coincides with the resonant frequency of the substrate 40, the piezoelectric element efficiently vibrates as long as the substrate 40 vibrates. As a result, the possible generation time is increased to improve the generation efficiency. Part of the kinetic energy externally exerted on the piezoelectric power generator is converted into vibration energy in the vibration portion of the substrate 40 and the vibration portion of the piezoelectric multilayer body 10. In this case, when the mass of the vibration portion of the substrate 40 is larger than the mass of the vibration portion of the piezoelectric multilayer body 10 and the resonant frequency excited on the substrate 40 coincides with the resonant frequency excited on the piezoelectric multilayer body 10, the vibration energy accumulated in the vibration portion of the substrate 40 can be made larger than the vibration energy of each vibration portion of the piezoelectric multilayer body 10. Since the vibration energy is efficiently transferred from the vibration portion of the substrate 40 to the vibration portion of the piezoelectric multilayer body 10 owing to the resonance in this case, the generation efficiency of the piezoelectric power generator is preferably improved. In addition, in a bending vibration mode in which the vibration portion of the substrate 40 and the vibration portion of the piezoelectric multilayer body 10 have the same resonant frequency, the vibration energy is preferably smoothly exchanged owing to the coincidence of the vibration mode.

In the second embodiment shown in FIG. 1(B), vibration externally exerted on the substrate 40 vibrates the vibration portion 51 and the vibration of the vibration portion 51 is transferred to the piezoelectric multilayer body 10 to generate electric power. The operational effects in the second embodiment are the same as in the first embodiment. In particular, the provision of the vibration portion 51 allows a specific resonant frequency different from the resonant frequency of the substrate 40 to be set. In addition, when the substrate 40 vibrates in the bending vibration mode, a node or a fixed end in the vibration of the vibration portion 51 provided in the substrate 40 by the notch 41 is arranged near the piezoelectric multilayer body 10, and an anti-node or a free end in the vibration of the vibration portion 51 is arranged apart from the piezoelectric multilayer body 10, the transfer distance of the vibration energy transferred from the vibration portion 51 to the piezoelectric multilayer body 10 through the substrate 40 is reduced by a distance corresponding to the bypass of the notch 41, compared with a case in which the anti-node or the free end in the vibration of the vibration portion 51 is arranged near the piezoelectric multilayer body 10 and the node or the fixed end in the vibration of the vibration portion 51 is arranged apart from the piezoelectric multilayer body 10. Accordingly, the transfer efficiency of the vibration energy transferred from the substrate 40 to the piezoelectric multilayer body 10 is preferably improved.

In the third embodiment shown in FIG. 1(C), vibration externally exerted on the substrate 40 vibrates the vibration portions 51 and 52 and the vibration of the vibration portions 51 and 52 is transferred to the piezoelectric multilayer body 10 to generate electric power. In the fourth embodiment shown in FIG. 1(D), vibration externally exerted on the substrate 40 vibrates the vibration portions 53 and 54 and the vibration of the vibration portions 53 and 54 is transferred to the piezoelectric multilayer body 10 to generate electric power. The operational effects in the third and fourth embodiments are the same as in the first and second embodiments. In particular, the provision of the two vibration portions 51 and 52 and the two vibration portions 53 and 54 having different resonant frequency allows the vibrations that are externally exerted and that have different frequency to be processed to generate the power with a higher efficiency.

In the piezoelectric power generator according to the present invention, each vibration portion provided in the substrate may have an arbitrary shape and the substrate may have an arbitrary number of vibration portions. For example, in order to control the vibration energy that is accumulated or the resonant frequency in the bending vibration mode, weights may be arranged at the anti-nodes or the free ends of the vibration portions 51, 52, 53, and/or 54. This arrangement is preferred because an increase in the vibration energy or a decrease in the resonant frequency can be relatively easily realized. The surfaces of the vibration portions 51, 52, 53, and/or 54 are not necessarily planes and may have steps (which include depressions and protrusions, and which may be integrated with the substrate 40 or separated from the substrate 40) (not shown) or may have through holes (not shown) provided therein. Such a step or through hole may change the rigidity of the substrate 40 to adjust the vibration modes and the resonant frequency of the vibration portions 51, 52, 53, and/or 54. The weight may be formed of the step itself or may be provided in a space provided by the depression or groove.

Figure 2:
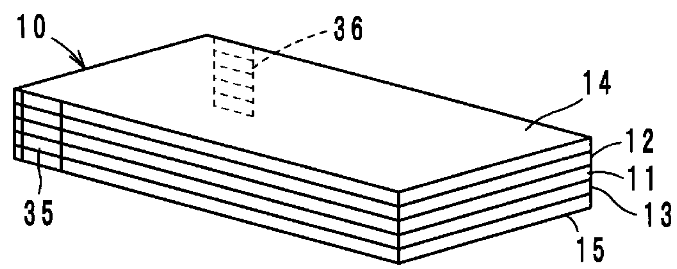
FIG. 2 is a perspective view showing an example of the appearance of a piezoelectric multilayer body.
Figure 3:
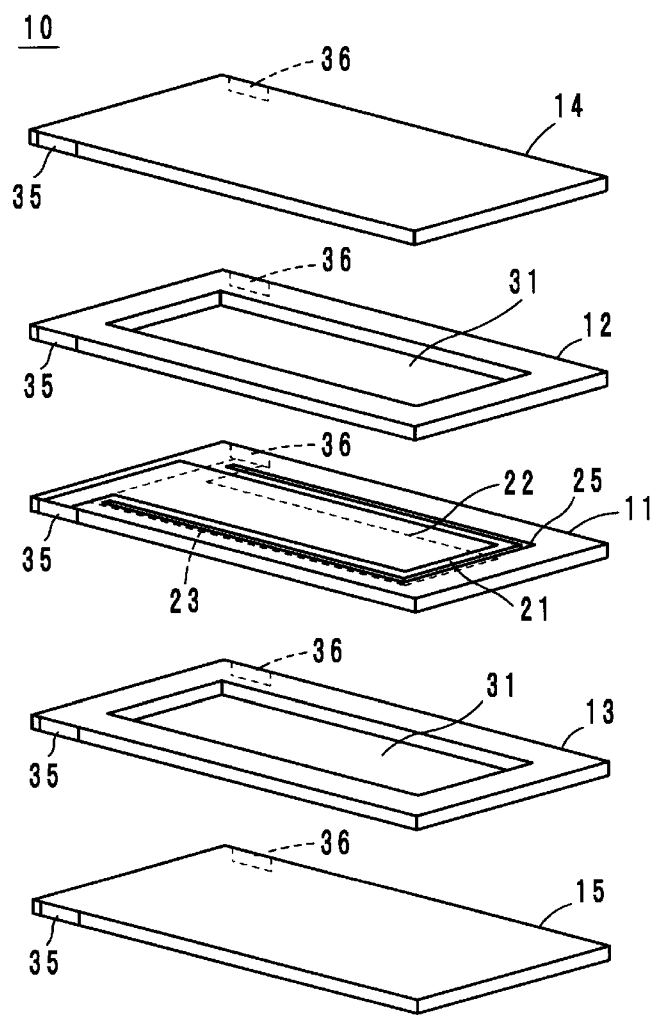
FIG. 3 is an exploded perspective view of the piezoelectric multilayer body.
Figure 4:
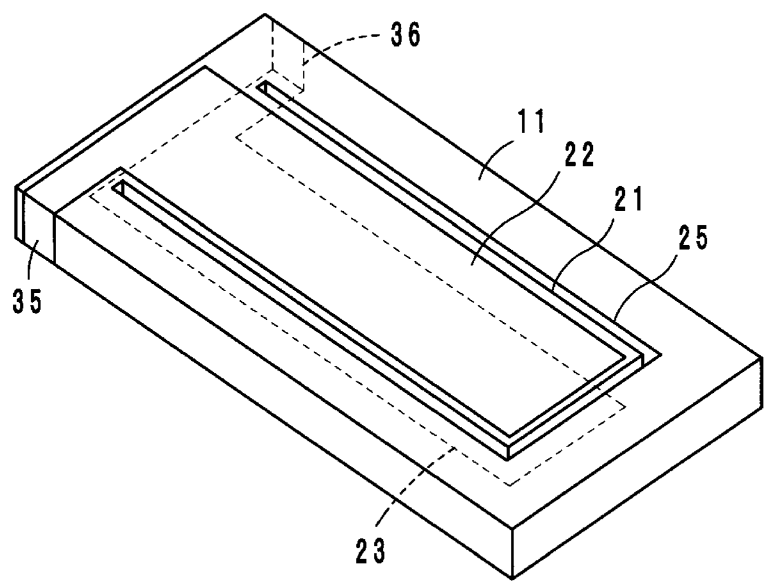
FIG. 4 is a perspective view showing a piezoelectric element layer composing the piezoelectric multilayer body.

(Configuration of Piezoelectric Multilayer Body, Refer to FIGS. 2 to 4)

An example of the configuration of the piezoelectric multilayer body 10 will now be described with reference to FIGS. 2 to 4. FIG. 3 shows an exploded structure of the piezoelectric multilayer body 10. Referring to FIG. 3, the piezoelectric multilayer body 10 includes a piezoelectric element layer 11, separator layers 12 and 13, and cover layers 14 and 15. The piezoelectric element layer 11 includes a vibration portion 21. Power extraction electrodes 22 and 23 are provided on the front and rear faces of the vibration portion 21. The separator layer 12 is stacked on the piezoelectric element layer 11 and includes a cavity 31 in which the vibration portion 21 is capable of vibrating, and the separator layer 13 is stacked under the piezoelectric element layer 11 and includes the cavity 31 in which the vibration portion 21 is capable of vibrating. The cover layer 14 is stacked on the separator layer 12, and the cover layer 15 is stacked under the separator layer 13.

The piezoelectric element layer 11 includes a through-hole groove 25 that passes through the piezoelectric element layer 11 such that the vibration portion 21 is positioned at a substantially central portion and that is substantially U-shaped in a plan view, as shown in FIG. 4. The power extraction electrode 22 on the front face extends to the left side face to be electrically connected to an outer electrode 35. The power extraction electrode 23 on the rear face extends to the right side face to be electrically connected to an outer electrode 36. The outer electrodes 35 and 36 are also formed on the side faces of the separator layers 12 and 13 and the cover layers 14 and 15. These outer electrodes 35 and 36 are integrally formed after the piezoelectric multilayer body 10 is formed as a multilayer body. The piezoelectric element layer 11, the separator layers 12 and 13, and the cover layers 14 and 15 are made of ceramic. Since the ceramic material has a relatively high melting point, it is possible to suppress an occurrence of heat capacity or thermal deformation, compared with a case of a resin material, in a compact apparatus that tends to have a low heat capacity, for example, also in a mounting process such as reflow soldering. Accordingly, it is possible to provide the compact piezoelectric power generator that has excellent heat resistance and that is excellent for suppressing a variation in the resonant frequency caused by a variation in dimensions and a variation in rigidity due to a change in temperature.

The vibration portion 21 is subjected to polarization in the piezoelectric multilayer body 10 having the above configuration. Upon exertion of external force on the piezoelectric multilayer body 10, the vibration portion 21 resonates in a length vibration mode or in the bending vibration mode due to a change in the external force or a change in the acceleration and electric power is extracted from the outer electrodes 35 and 36. In the vibration of the vibration portions having similar dimensions, the resonant frequency is relatively high in the length vibration mode and the resonant frequency is relatively low in the bending vibration mode. The resonant frequency of the vibration portion 21 tends to increase as the piezoelectric multilayer body 10 is reduced in size. With the bending vibration mode, it is possible to further reduce the size of the piezoelectric multilayer body 10 without changing the resonant frequency.

In the power generation in the bending vibration mode, it is necessary to provide an intermediate electrode (not shown), in addition to the front-face and rear-face electrodes 22 and 23. The intermediate electrode composes a so-called series bimorph when it functions as a polarization electrode and also composes a parallel bimorph generating electric charge between the front-face and rear-face electrodes 22 and 23 and the intermediate electrode that are short-circuited due to isotropic polarization. Both the series bimorph and the parallel bimorph can be realized by using a layered structure technology.

The piezoelectric multilayer body 10 has a simple configuration in which the piezoelectric element layer 11, the separator layers 12 and 13, and the cover layers 14 and 15 are stacked and is easily reduced in size. In addition, since each layer in the piezoelectric multilayer body 10 is made of ceramic, it is possible to easily manufacture the piezoelectric multilayer body 10 by integrally firing the layers by using a layering process.

The piezoelectric element layer 11, the separator layers 12 and 13, and the cover layers 14 and 15 are made of ceramic in the piezoelectric multilayer body 10. Accordingly, it is possible to easily manufacture the compact piezoelectric multilayer body 10 having a simple configuration by a layering process using ceramic sheets. In particular, when the respective layers are made of ceramic materials having approximately the same coefficient of thermal expansion (preferably having the same composition), the stress caused by the difference in the thermal expansion is reduced to improve the durability. In addition, since the difference in contraction in the firing process is also reduced, the dimensional accuracy is improved and the stress concentration is reduced. As a result, the durability against cyclic loading is also improved to further reduce the size of the piezoelectric multilayer body 10. Furthermore, since load bearing conditions in design can be relieved, it is possible to improve the degree of freedom in design, for example, in selection of materials and shapes.

The shape of the vibration portion 21 formed in the piezoelectric element layer 11 can be varied and the resonant frequency can be varied depending on the shape of the vibration portion 21. In addition, multiple vibration portions 21 having the same shape or different shapes may be formed on one piezoelectric element layer 11. In order to operate the piezoelectric element layer 11 at multiple resonant frequencies, multiple piezoelectric element layers 11 including the vibration portions 21 that have different resonant frequency may be stacked via the separator layers 12 and 13. When the multiple vibration portions 21 are combined, the vibration portions 21 may be electrically connected in parallel to each other or may be electrically connected in series to each other.

(Wireless Sensor Network Apparatus)

Figure 5:
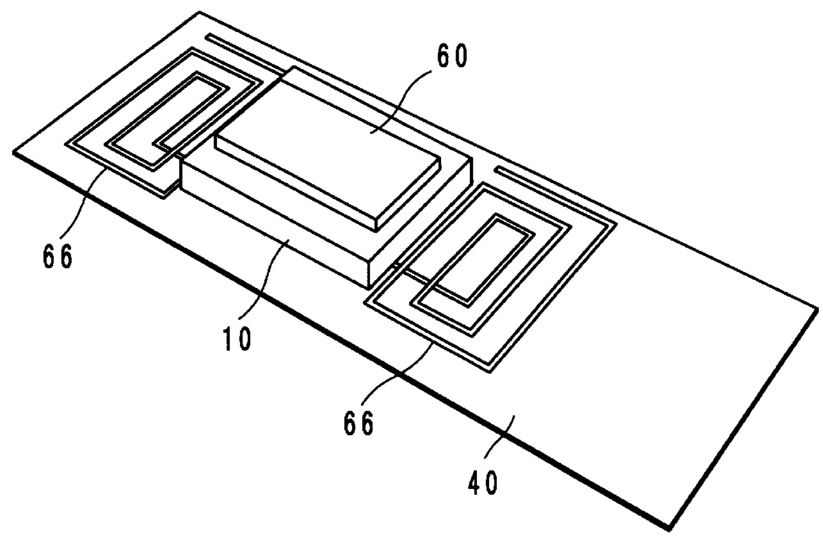
FIG. 5 is a perspective view showing a first embodiment of a wireless sensor network apparatus according to the present invention.

FIG. 5 shows a first embodiment of a wireless sensor network apparatus according to the present invention. This wireless sensor network apparatus includes a module 60, the piezoelectric multilayer body 10, and the substrate 40. The module 60 includes a rectifier circuit 61 rectifying alternating current output from the piezoelectric element into direct current, an electric storage unit 62 accumulating the power rectified by the rectifier circuit 61, a sensor 63, an analog-to-digital (A/D) conversion circuit 64 converting a signal output from the sensor 63 into a digital signal, and a signal conversion-transmission circuit 65, as shown in FIG. 7. The piezoelectric multilayer body 10 is mounted on the substrate 40, and the module 60 is mounted on the piezoelectric multilayer body 10. In addition, antennas 66 (refer to FIG. 5 and FIG. 6) for transmitting signals to a host apparatus (not shown) are provided on the surface of the substrate 40.

This wireless sensor network apparatus is mounted on, for example, a tire wheel to detect the internal pressure of a tire of an automobile. The vibration of the wheel is transferred to the piezoelectric element through the substrate 40, and the electric power that is generated is accumulated in the electric storage unit 62. Necessary power is supplied from the electric storage unit 62 to the sensor 63, the A/D conversion circuit 64, and the signal conversion-transmission circuit 65.

Since the piezoelectric multilayer body 10, the module 60, and the antennas 66 are integrally mounted on the substrate 40 in the wireless sensor network apparatus, the components are mounted at high density and the wireless sensor network apparatus is reduced in size and cost. In addition, since the resonant frequency of the substrate 40 coincides with the resonant frequency of the piezoelectric element, the wireless sensor network apparatus has the advantages of, for example, the improved generation efficiency, as described above.

Figure 6:
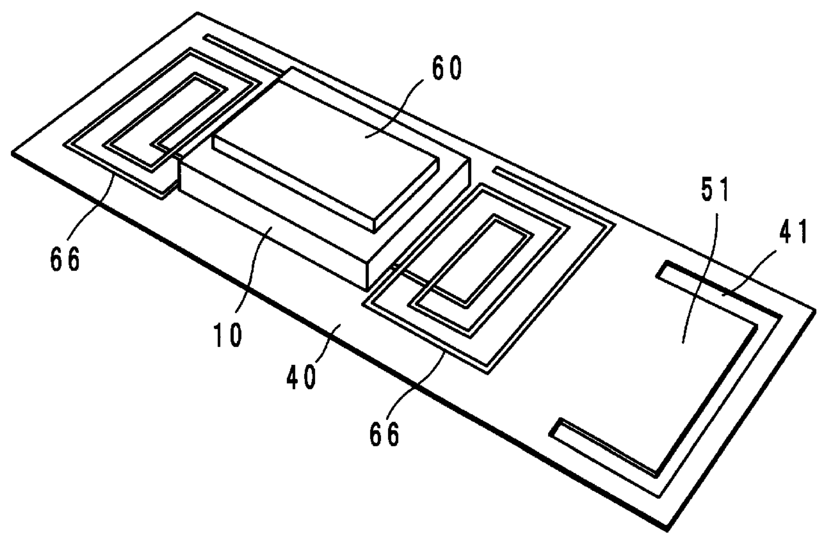
FIG. 6 is a perspective view showing a second embodiment of the wireless sensor network apparatus according to the present invention.
Figure 7:
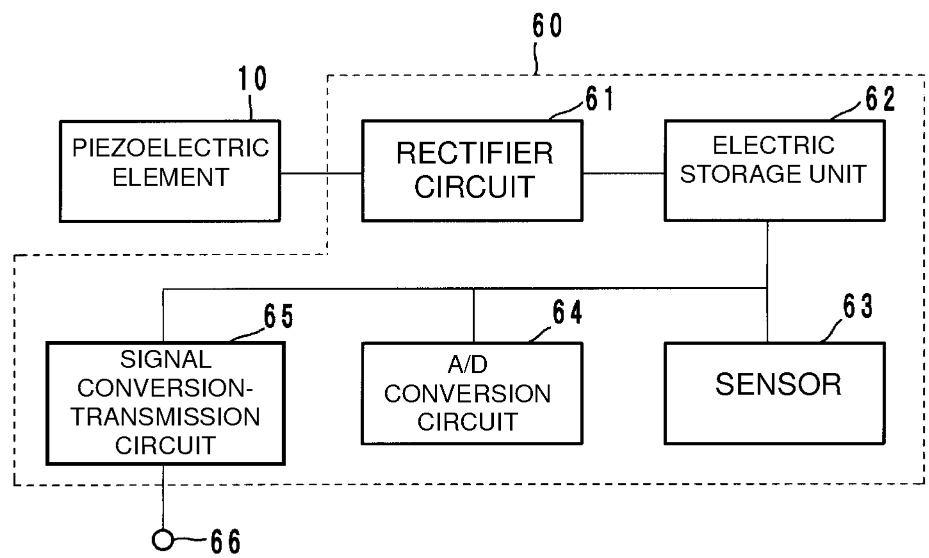
FIG. 7 is a block diagram showing a circuit configuration of the wireless sensor network apparatus.

In a second embodiment of the wireless sensor network apparatus shown in FIG. 6, the vibration portion 51 is formed in the substrate 40. The effects and advantages of the wireless sensor network apparatus in the second embodiment are the same as the ones described above with reference to FIG. 1(B). Multiple vibration portions may be formed in the substrate 40.

Other Embodiments

The piezoelectric power generator and the wireless sensor network apparatus according to the present invention are not limited to the embodiments described above, and changes and variations may be made within the spirit and scope of the invention.

For example, the sensor provided in the wireless sensor network apparatus has various detection targets. The sensor may be a temperature sensor, a humidity sensor, an illumination sensor, or a vibration sensor.

As described above, the present invention is useful for the piezoelectric power generator and the wireless sensor network apparatus. In particular, the present invention is superior in the improved generation efficiency, the reduction in size, and the reduction in cost.

REFERENCE NUMBERS LIST

10 piezoelectric multilayer body
11 piezoelectric element layer
40 substrate
41, 42, 43, 44 notch
51, 52, 53, 54 vibration portion
60 module
63 sensor
65 signal conversion-transmission circuit
66 antenna

The invention claimed is:

1. A piezoelectric power generator comprising:
a substrate having at least one vibration portion; and
a piezoelectric element that converts vibration into electricity mounted on the substrate, the piezoelectric element having at least one vibration portion,
wherein a mass of the at least one vibration portion of the substrate is larger than a mass of the at least one vibration portion of the piezoelectric element, and
wherein the piezoelectric element is configured to vibrate in a bending vibration mode, and a resonant frequency of the substrate coincides with a resonant frequency of the bending vibration mode.

2. A piezoelectric power generator comprising:
a substrate having at least one vibration portion; and
a piezoelectric element that converts vibration into electricity mounted on the substrate, the piezoelectric element having at least one vibration portion,
wherein a mass of the at least one vibration portion of the substrate is larger than a mass of the at least one vibration portion of the piezoelectric element, and
wherein a resonant frequency of the at least one vibration portion of the substrate coincides with a resonant frequency of the piezoelectric element.

3. The piezoelectric power generator according to claim 2, wherein the at least one vibration portion of the substrate is defined by a notch.

4. The piezoelectric power generator according to claim 1, wherein the at least one vibration portion of the substrate includes a first vibration portion and a second vibration portion, and a resonant frequency of the first vibration portion and a resonant frequency of the second vibration portion are different from each other.

5. A wireless sensor network apparatus comprising:
a substrate having at least one vibration portion;
a piezoelectric power generator mounted on the substrate, the piezoelectric power generator including a piezoelectric element having at least one vibration portion and configured to convert vibration into electricity;
a wireless communication apparatus mounted on the substrate; and
a sensor element mounted on the substrate,
wherein a mass of the at least one vibration portion of the substrate is larger than a mass of the at least one vibration portion of the piezoelectric element, and
wherein the piezoelectric element is configured to vibrate in a bending vibration mode, and a resonant frequency of the substrate coincides with a resonant frequency of the bending vibration mode.

6. The wireless sensor network apparatus according to claim 5, wherein the wireless communication apparatus includes an antenna.

7. A wireless sensor network apparatus comprising:
a substrate having at least one vibration portion;
a piezoelectric power generator mounted on the substrate, the piezoelectric power generator including a piezoelectric element having at least one vibration portion and configured to convert vibration into electricity;
a wireless communication apparatus mounted on the substrate; and
a sensor element mounted on the substrate,
wherein a mass of the at least one vibration portion of the substrate is larger than a mass of the at least one vibration portion of the piezoelectric element, and
wherein a resonant frequency of the at least one vibration portion of the substrate coincides with a resonant frequency of the piezoelectric element.

8. The wireless sensor network apparatus according to claim 7, wherein the at least one vibration portion of the substrate is defined by a notch.

9. The wireless sensor network apparatus according to claim 6, wherein the at least one vibration portion of the substrate includes a first vibration portion and a second vibration portion, and a resonant frequency of the first vibration portion and a resonant frequency of the second vibration portion are different from each other.

10. The wireless sensor network apparatus according to claim 7, wherein the wireless communication apparatus includes an antenna.

11. The wireless sensor network apparatus according to claim 7, wherein the at least one vibration portion of the substrate includes a first vibration portion and a second vibration portion, and a resonant frequency of the first vibration portion and a resonant frequency of the second vibration portion are different from each other.

12. The piezoelectric power generator according to claim 2, wherein the at least one vibration portion of the substrate includes a first vibration portion and a second vibration portion, and a resonant frequency of the first vibration portion and a resonant frequency of the second vibration portion are different from each other.

* * * * *